US006852639B2

United States Patent
Rudolph et al.

(10) Patent No.: US 6,852,639 B2
(45) Date of Patent: Feb. 8, 2005

(54) ETCHING PROCESSING METHOD FOR A MATERIAL LAYER

(75) Inventors: Matthias Rudolph, Dresden (DE); Jens Stolze, Dresden (DE); Thomas Morgenstern, Dresden (DE); Jana Haensel, Dresden (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 10/210,757

(22) Filed: Jul. 31, 2002

(65) Prior Publication Data

US 2004/0023507 A1 Feb. 5, 2004

(51) Int. Cl.[7] .............................................. H01L 21/302
(52) U.S. Cl. ..................... 438/714; 438/719; 438/723
(58) Field of Search ................................ 438/706, 710, 438/714, 719, 720, 723, 724, 725

(56) References Cited

U.S. PATENT DOCUMENTS

| | | | | |
|---|---|---|---|---|
| 5,690,781 A | * | 11/1997 | Yoshida et al. | 156/345.48 |
| 5,980,766 A | * | 11/1999 | Flamm et al. | 216/59 |
| 6,077,787 A | * | 6/2000 | Reinhard et al. | 438/697 |
| 6,329,297 B1 | * | 12/2001 | Balish et al. | 438/714 |
| 6,409,933 B1 | * | 6/2002 | Holland et al. | 216/68 |
| 6,562,190 B1 | * | 5/2003 | Kuthi et al. | 156/345.44 |

FOREIGN PATENT DOCUMENTS

WO          WO 02/05308 A2     1/2002

* cited by examiner

*Primary Examiner*—Kin-Chan Chen
(74) *Attorney, Agent, or Firm*—Laurence A. Greenberg; Werner H. Stemer; Ralph E. Locher

(57) ABSTRACT

The present invention provides a processing method that changes the given and unfavorable surface contour of a material layer to a predetermined, more favorable surface contour at least along a selected radial direction of the workpiece. Due to the fact that the etch process included into the processing method affects the whole workpiece simultaneously, a high throughput is achievable and the etching method is easily applied in an industrial setting, for example for the mass production of semiconductor products.

29 Claims, 4 Drawing Sheets

ETCHING PROCESSING METHOD FOR A MATERIAL LAYER

FIELD OF THE INVENTION

The present invention relates to a processing method for providing a processed material layer on a workpiece. More specifically, the present invention relates to a processing method for providing a processed material layer on a semiconductor substrate.

BACKGROUND OF THE INVENTION

During the manufacture of miniaturized devices such as integrated circuits (IC's) and the like, intermediate and/or final structures are often formed whereby a material layer that is provided on a workpiece should have a predetermined surface contour. This may occur, for example, during the formation of isolation structures between semiconductor devices.

In the formation of integrated circuits, the manufacture of isolation structures between semiconductor devices for insulating purposes is crucial. In either ULSI or in VLSI, already a very small amount of leakage current can induce significant power dissipation for the entire circuit. Therefore, it is very important to form an effective isolation between semiconductor devices. In addition, with the ongoing trend towards higher density integration, effective isolation must be provided in a smaller isolation space.

Trench isolation is one of the newer approaches that has been adopted adopted and it is used primarily for isolating devices in VLSI and ULSI. Trench isolation can be considered as a replacement for conventional LOCOS isolation. As seen in FIG. 5, in the basic STI technology, a pad layer 110 is first formed on the semiconductor wafer 100. The pad layer 110 may be formed by oxidizing a bare silicon wafer in a furnace to grow the pad oxide layer 110 of about 100 to 250 angstroms thickness. The pad oxide layer 110 is most typically formed from silicon dioxide.

Next, a furnace silicon nitride layer 120 of about 1500 to 2000 angstroms thickness is deposited on the pad oxide layer. The silicon nitride layer 120 is used as a mask layer and is formed on the pad oxide layer 110. Subsequently, a masking and etching step is performed to form trenches 130, for example about 0.4 to 0.5 $\mu$m in depth, by anisotropically etching into the silicon wafer.

Next, an oxide is deposited onto the wafer. The oxide may be a CVD oxide or a high density plasma chemical vapor deposition (HDPCVD) oxide. Typically, the oxide 140 needs to be planarized using a chemical mechanical polishing (CMP) technique.

The use of silicon nitride in the formation of trenches is a common technique. Indeed, not only is silicon nitride used in the formation of trenches for STI, but also in the formation of trenches for DRAM trench capacitors.

It has been found that when performing the CMP process to planarize the oxide layer 140, a within wafer variation in the planarity of the silicon nitride layer exists. In other words, the silicon nitride layer is not uniformly planar over an entire wafer. Especially, the silicon nitride layer usually exhibits a dish-like shape. This variation in the thickness of silicon nitride layer can be caused by the method of layer deposition and/or by intermediate process steps after the silicon nitride layer has been deposited, for example, a recess etch step during the formation of deep trench capacitors. The variation in the silicon nitride level causes variation in the planarity of the STI structures, which can severly decrease the overall quality of the final semiconductor product.

SUMMARY OF THE INVENTION

The foregoing and other problems are overcome by the processing method as specified in independent claim 1. Further advantageous features, aspects and details of the invention are evident from the dependent claims, the description and the accompanying drawings. The claims are intended to be understood as a first non-limiting approach of defining the invention in general terms.

According to the present invention, a processing method is provided that is capable of changing the given and unfavorable surface contour of a material layer to a more favorable surface contour.

The present invention provides a processing method for providing a processed material layer on a workpiece, said method comprising the steps of:

providing a material layer on a workpiece having an upper surface with a given surface contour along a radial direction of said workpiece and positioning the workpiece in a process chamber;

performing an etch process whereby the whole upper surface of the material layer is simultaneously affected; and adjusting the etch rate as a non-constant function of the distance from the center of said workpiece, so that a processed material layer having a predetermined surface contour along said radial direction of said workpiece results.

The present invention provides a processing method that changes the given and unfavorable surface contour of a material layer to a predetermined, more favorable surface contour at least along a selected radial direction of the workpiece. However, since, in most cases, the relevant surface portions of the material layers on a workpiece are rotationally symmetric with respect to the center of the workpiece, this automatically results into predetermined surface contour along all radial directions of the workpiece. Due to the fact that the etch process affects the whole upper surface of the material layer simultaneously, a high throughput is achievable and the etching method is easily applied in an industrial setting, for example, for the mass production of semiconductor products.

The processing method according to the present invention provides a processed material layer that exhibits a predetermined surface contour at least along a selected radial direction of the workpiece. Depending on the actual application, this leads to an improved quality of the resulting products either based on the characteristics of the processed layer itself or based on positve effects that the predetermined surface contour has on the quality of subsequent process steps like, for example CMP process steps.

According to a preferred embodiment of the method according to the present invention, said workpiece is a semiconductor substrate (wafer) having a diameter of at least 200 mm and even more preferred, said workpiece is a semiconductor substrate (wafer) having a diameter of at least 300 mm.

According to a further preferred embodiment of the method according to the present invention, said material layer is a mask layer, especially a hard mask layer. Mask layers are usually used to transfer a desired pattern onto the workpiece. Thereby, the quality of the pattern transfer and subsequently the quality of the resulting products depends decisively on the surface contour of the mask layer. Accordingly, by improving the quality of the mask layer, the processing method according to the present invention can be used to improve the quality and the stability of the overall production process.

According to a further preferred embodiment of the method according to the present invention, said material layer comprises a silicon nitride layer, a polysilicon layer or a silicon oxide layer.

The processing method according to the present invention uses an etch process in order to affect the material layer. Suitable etch processes include physical etch processes, chemical etch processes and combinations thereof. According to a preferred embodiment of the method according to the present invention, said etch process is a plasma etch process. According to a still further preferred embodiment of the method according to the present invention, said plasma etch process is a plasma sputter etch process. During the manufacture of miniaturized devices such as integrated circuits (IC's) and the like, intermediate and/or final structures are often formed with combinations of various patterned materials defined thereon. Those combinations may, for example, be composed of oxides and nitrides of silicon disposed adjacent to one another. The oxides and nitrides may be further disposed adjacent to monocrystalline, polycrystalline or other forms of silicon. By using a plasma sputter etch process, wherein the etch effect on the material layer is primarily based on a physical component, unwanted side-effects based on chemical reactions with those other materials can be largely avoided.

According to a still further preferred embodiment of the method according to the present invention, said etch process uses an inert gas, especially Ar, as an etch gas.

According to a still further preferred embodiment of the method according to the present invention, the etch rate is adjusted by adjusting the plama density as a function of the distance from the center of said workpiece. Furthermore, it is preferred that the plasma is controlled by at least two independently controllable coils. Thereby, it is preferred that at least one of the at least two independently controllable coils is a solenoid coil. Furthermore, it is preferred that said coils are arranged concentrically.

According to a still further preferred embodiment of the method according to the present invention, said etching process is applied in direct succession of a usual etch step. Thereby, additional wafer handling and/or process preparation can be avoided.

According to a still further preferred embodiment of the method according to the present invention, said method contains additional steps including: determining at least one parameter of the material layer before the etch process is performed; and adjusting the parameters of the etch process based on said parameter of the unprocessed material layer. Suitable parameters include the thickness of the material layer and the thickness variation of the material layer over the wafer.

According to a still further preferred embodiment of the method according to the present invention, said method contains additional steps including: determining at least one parameter of the material layer after the etch process is performed; and adjusting the parameters of the etch process based on said parameter of the processed material layer. Suitable parameters again include the thickness of the material layer and the thickness variation of the material layer over the wafer.

According to a still further preferred embodiment of the method according to the present invention, said method contains additional steps including: determining at least one parameter of the material layer before the etch process is performed; determining at least one parameter of a previous material layer after the etch process is performed; and adjusting the parameters of the etch process based on said determined parameters. Thereby, those adjustments of the parameters of the etch process may also affect the etch rate of the etch process.

BRIEF DESCRIPTION OF THE DRAWINGS

Some of the above indicated and other more detailed aspects of the invention will be described in the following description and partially illustrated with reference to the figures. Wherein.

DESCRIPTION OF THE PREFERRED EMBODIMENTS

Figure 1:
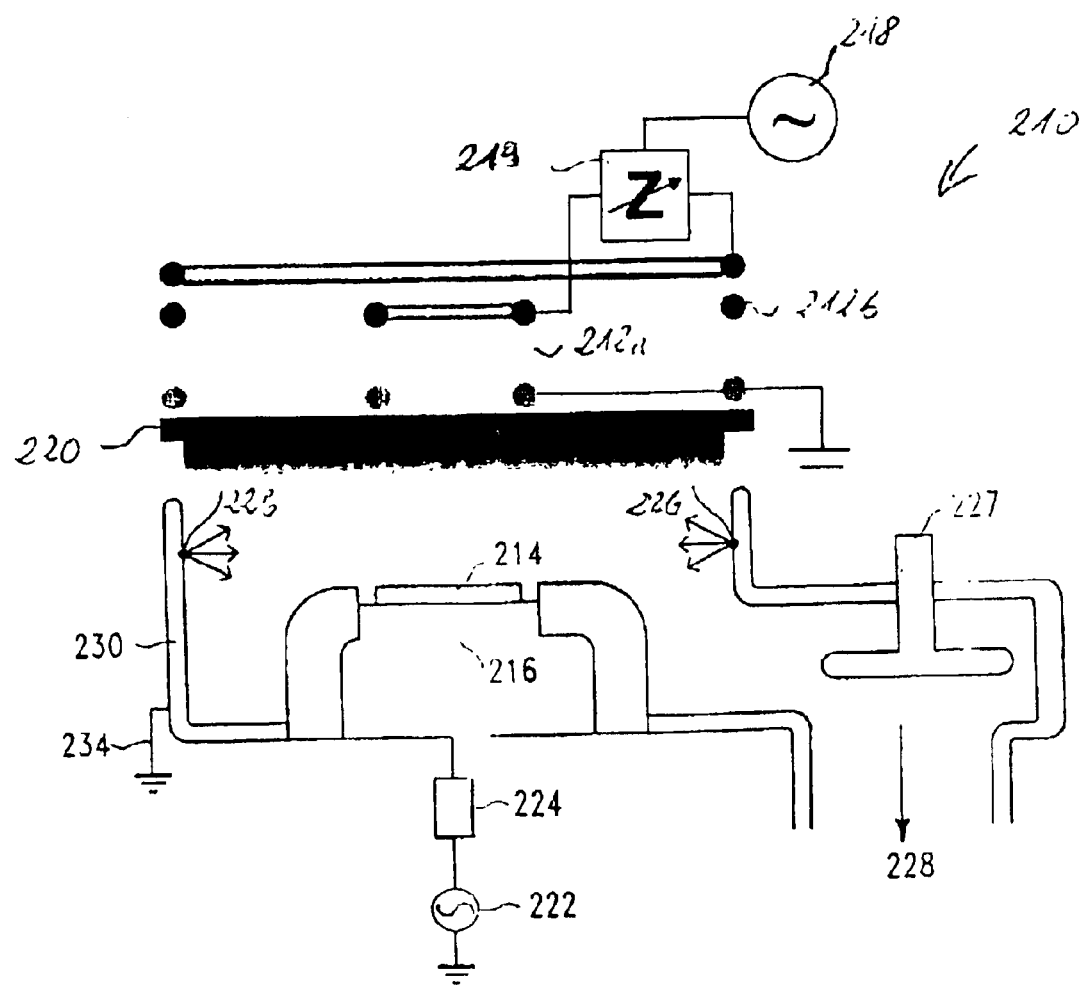
FIG. 1 shows schematically a system that can preferably be used to perform the method according to the present invention.

FIGS. 1 shows schematically a system that can preferably be used to perform the method according to the present invention. The plasma processing chamber enables the processing of a 12 inch (300 mm) diameter silicon substrate surface. Similar systems that may also preferably be used to perform the method according to the present invention are described in the document WO 02/05308 assigned to Applied Materials, Inc., the disclosure of which is hereby incorporated herein by reference in its entirety.

FIG. 1 shows an etching process chamber 210, which is constructed to include two inductive coil antenna segments 212a and 212b, positioned concentrically exterior to a dielectric ceiling 220, and connected to a radio frequency (RF) power generator 218. The radio frequency (RF) power generator 218 may be a source power generator with a frequency tunable around 13.56 MHz for impedance matching at different plasma conditions, or it may be a source power generator of fixed frequency which is connected through an impedance matching network 219. Process chamber 210 also includes a substrate 214 and a support pedestal (cathode) 216 which is connected to an RF frequency power generator 222 (bias power generator at a fixed frequency ranging between about 400 kHz and 13.56 MHz) through an impedance matching network 224, and a conductive chamber wall 230 which serves as the electrical ground 234.

In the preferred example shown in FIG. 1, the radio frequency (RF) power generator 218 and the impedance matching network 219 provide a common power source having two differentially adjustable power outputs for the two inductive coil antenna segments 212a, and 212b. As an alternative, two independent power sources, each having its own power generator and its own impedance matching network, for driving the two inductive coil antenna segments 212a and 212b, may also be used.

In the preferred example shown in FIG. 1, two inductive coil antenna segments 212a and 212b are provided. However, a process chamber having more than two, especially three, inductive coil antenna segments may also be used. In that case, it is preferred that a single common power source having at least three differentially adjustable power outputs for the different inductive coil antenna segments is provided.

Figure 2A:
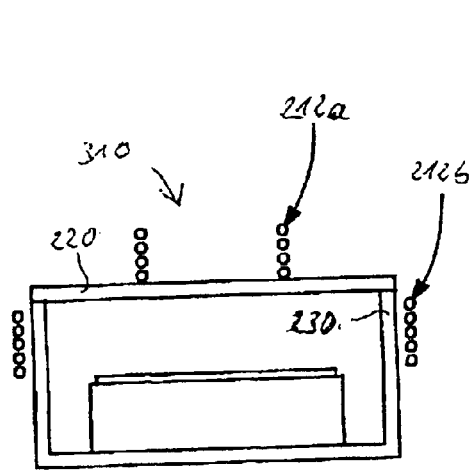
FIG. 2A–2E shows schematically various systems that can preferably be used to perform the method according to the present invention.

FIG. 1 illustrates a process chamber having a flat ceiling 220 wherein both inductive coil antenna segments 212a and 212b are positioned on top of the flat ceiling 220. FIG. 2A shows schematically a further process chamber 310 for the practise of the present invention in which the outer inductive coil antenna 212b is placed at the level of the side wall 230 of the process chamber so that it surrounds the side wall 230 rather than overlying the ceiling 220.

Figure 2B:
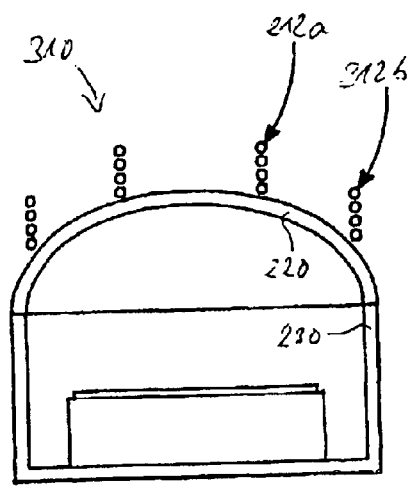
Figure 2C:
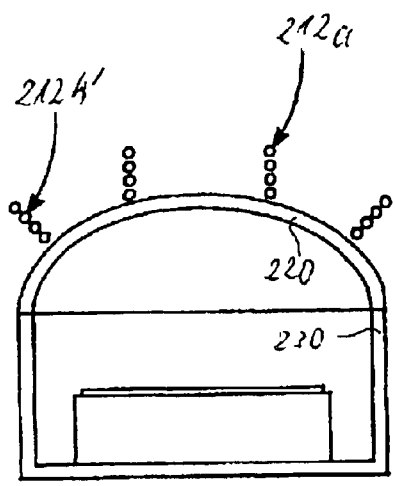
Figure 2D:
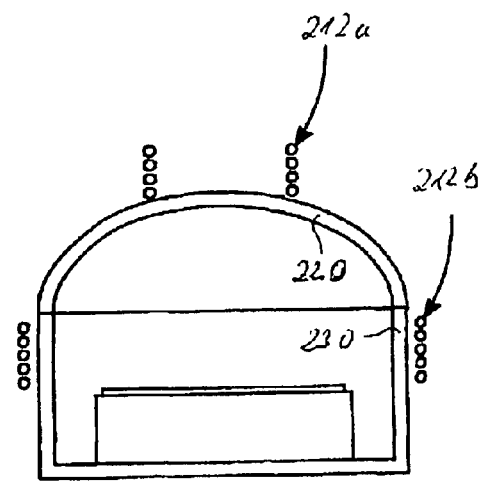

Furthermore, a process chamber having a dome-shaped ceiling instead of a flat ceiling may also be used. FIG. 2B illustrates a process chamber 310 for the practise of the present invention in which two solenoid coil antennas are arranged on a dome-shaped ceiling. FIG. 2C illustrates a version of FIG. 2B in which the solenoid of the outer antenna 212b is modified to be an antenna 212b' having an inverted conical sectional shape to it so that the cross-section is perpendicular to the surface of the dome-shaped ceiling. FIG. 2D illustrates a process chamber which corresponds to the process chamber shown in FIG. 2A with the exception that the ceiling is dome-shaped.

Figure 2E:
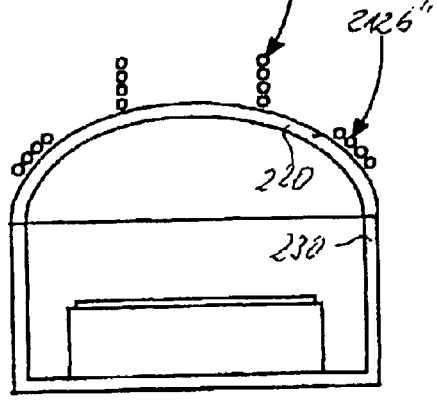

In the examples shown so far two solenoidal coil antennas 212a and 212b are provided. However, coil antennas of the flat ("pancake") type may also be used. FIG. 2E shows an example in which the outer antenna 212b is modified to be a conformal, flat antenna 212b" that conforms with the sloping and nearly vertical surface of the outer section of the dome-shaped ceiling.

As can be seen from FIG. 1, the workpiece 214, preferably a semiconductor substrate (wafer), is placed on the support pedestal 216 and gaseous components are fed into the process chamber through entry ports 226. A plasma is ignited in the process chamber 210 by applying RF powers 218 and 222. Pressure interior to the etch process chamber 210 is controlled using a vacuum pump (not shown) and a throttle valve 227 situated between process chamber 210 and the vacuum pump.

The temperature on the surface of the etch chamber walls may be controlled using liquid-containing conduits (not shown) which are located in the walls of the etch chamber 210. The temperature of the semiconductor substrate may be controlled by stabilizing the temperature of the support pedestal. This may, for example, be achieved by flowing helium gas in the channels formed by the back of the substrate and grooves (not shown) on the pedestal 216 surface.

The RF power applied to the inductive coil antenna segments 212a and 212b and to the substrate pedestal 216 may be selected to range from about 50 kHz to as high as 13.56 MHz, and may vary in wattage from a few hundred watts to several thousand watts. The power applied to the substrate pedestal 216 may also be DC rather than RF alternating current.

Figure 3:
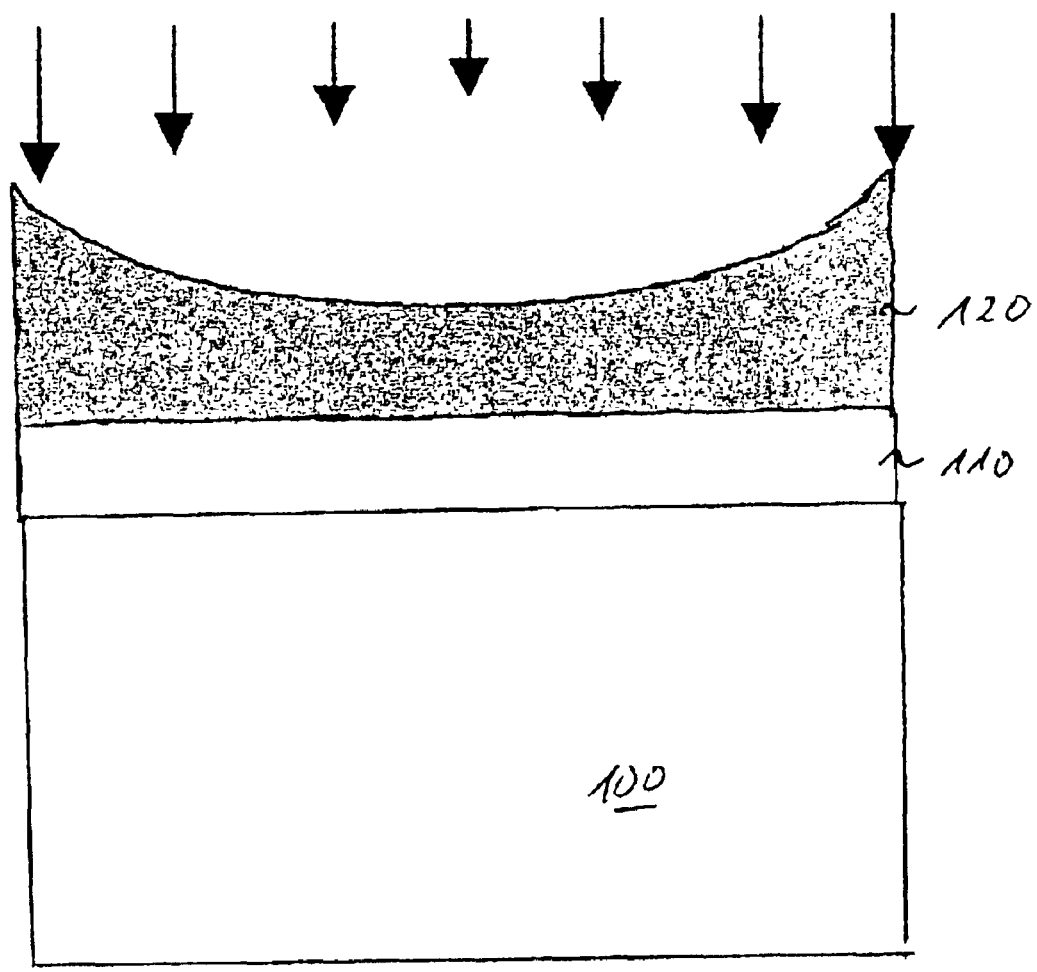
FIG. 3 shows a schematic view on a material layer having a given surface contour.

The workpiece 214 includes the to-be-etched material layer, for example, a silicon nitride material 120 (FIG. 3). A substrate 100 composed of silicon oxide and/or silicon is typically included in the workpiece 214 with one or both of the silicon oxide and silicon positioned adjacent to the to-be-etched silicon nitride material 120. The materials of substrate 100 may include one or more materials such as silicon oxide or silicon nitride or amorphous silicon or poly- or monocrystalline silicon or other materials as may be suitable for a specific application. Examples of workpieces 214 include 6 inch, 8 inch, 12 inch or wider diameters of silicon wafers as used conventionally in the semiconductor device manufacturing industry.

Figure 5:
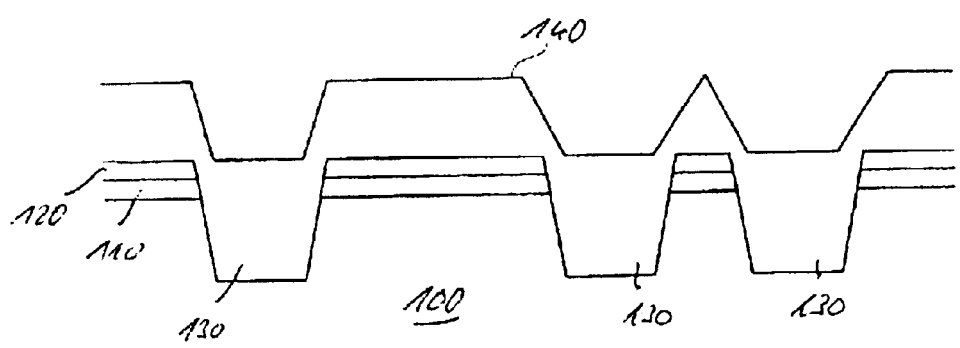
FIG. 5 illustrates the basic process step in the formation of a shallow trench isolation according to the prior art.

FIG. 3 shows an enlarged view on the workpiece 214 including the to-be-etched silicon nitride layer 120, having a given surface contour. As outlined with respect to FIG. 5, silicon nitride layer 120 is usually used as a mask layer and contains a variety of openings, for example, corresponding to trench capacitors (not shown) formed in the silicon substrate. However, those openings in the silicon nitride layer 120 are not shown for sake of clarity.

Subsequently, a sputter etch step is performed whereby the whole upper surface of the workpiece 214 is simultaneously affected and the etch rate is adjustable depending on the distance from the center of said workpiece, so that an etched silicon nitride material layer 120 having a predetermined surface contour along said radial direction of said workpiece 214 results.

For performing said sputter etch step, Ar gas is fed into the process chamber through entry ports 226. A plasma is then ignited in the process chamber 210 by applying RF powers 218 and 222. By controlling the ratio between the currents flowing through two inductive coil antenna segments 212a and 212b the local density of the plasma can adjusted. The local adjustment of the density of the plasma leads to a corresponding adjustment of the local etch rate which is indicated by the length of the arrows in FIG. 3. Accordingly, a sputter etch step is performed whereby the whole workpiece is simultaneously affected and the etch rate is adjustable as a non-constant function of the distance from the center of said workpiece.

Preferred process parameters for the sputter etch step according to the present invention include:

| | |
|---|---|
| Pressure: | 2–20 mTorr |
| Source Power: | 300–2000 Watt |
| Bias Power: | 50–400 Watt |
| Ar-Flow: | 150–250 sccm |
| Current ratio: | 0.25–5:1 |

Herein, the term "Source Power" describes the output of the radio frequency (RF) power generator 218 whereas the term "Bias Power" describes the output of the bias power generator 222. Furthermore, the term "Current ratio" describes the ratio of the current flowing through outer antenna 212b with respect to the current flowing through the inner antenna 212a.

In the present example, the process parameters for the sputter etch step is kept constant during the duration of the sputter etch step. However, one or more process parameters, for example the current ratio, may also be changed, either stepwise or continuously, during the sputter etch process, in order to provide a processed material layer having a predetermined surface contour.

Figure 4:
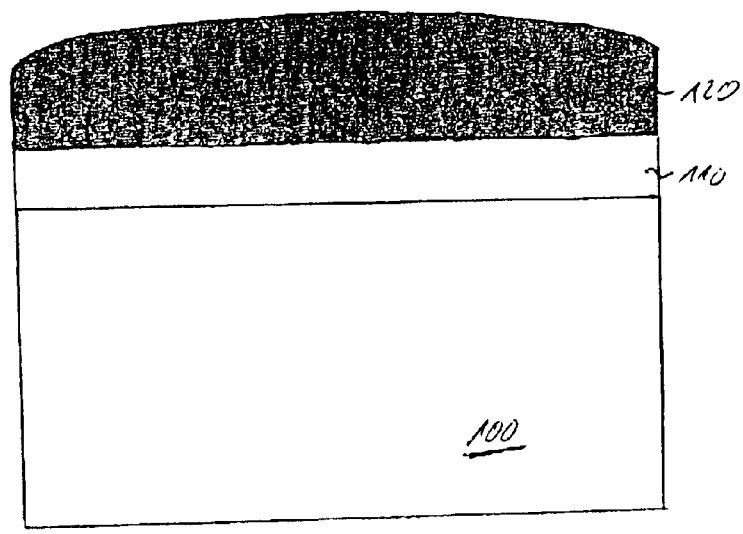
FIG. 4 shows a schematic view on a material layer having a predetermined surface contour as result of an embodiment of the inventive method.

FIG. 4 shows an enlarged view on the workpiece 214 including the etched silicon nitride material 130 having a predetermined surface contour as the result of the sputter etch step. As can be seen from FIG. 4, the unfavorable dish-like surface contour of silicon nitride material 130 has been transformed into a far smoother more favorable surface contour.

Preferably, the processing method according to the present invention is applied in direct succession of a usual etch step, for example a recess etch. Thereby, additional wafer handling and/or process preparation can be avoided. In the present example, the etching method directly applied after a recess etch step which is used to remove some polysilicon deposited into the trenches of the trench capacitors. Usually, this recess step is the last step in connection with the production of the trench capacitors. The following process steps are then designed to form the isolation and the transistors.

In order to adapt the processing method according to the present invention more specifically to the material layer that has to be processed, it is preferred that at least one parameter of the material layer is determined, for example measured, before the etch process is performed. Suitable parameters include the thickness of the material layer and the thickness variation of the material layer over the wafer. Based on said parameter or parameters of the unprocessed material layer the parameters of the etch process are adjusted.

Furthermore, it is also preferred that at least one parameter of the material layer is determined, for example measured, after the etch process is performed, in order to controll the quality of processing method. Based on said parameter or parameters of the processed material layer the parameters of the etch process are adjusted, in oder to improve the results for subsequent processing.

The present invention provides a processing method that changes the given and unfavorable surface contour of a material layer to a predetermined, more favorable surface contour at least along a selected radial direction of the workpiece. Due to the fact that the etch process affects the whole workpiece simultaneously, a high throughput is achievable and the processing method easily applied in an industrial setting, for example for the mass production of semiconductor products.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be accordingly defined by the claims appended hereto.

We claim:

1. A processing method for providing a processed material layer on a workpiece, the method which comprises:
   providing a workpiece extending in a radial direction and providing the workpiece with a material layer having an upper surface with a given surface contour along the radial direction;
   positioning the workpiece in a process chamber;
   performing a plasma etch process simultaneously affecting all of the upper surface of the material layer;
   controlling a plasma for the plasma etch process using at least two coils connected to adjustable power outputs; and
   adjusting an etch rate as a non-constant function of a distance from a center of the workpiece by adjusting a plasma density as a function of the distance from the center of the workpiece such that the material layer becomes a processed material layer having a predetermined surface contour along the radial direction of the workpiece.

2. The method according to claim 1, which comprises providing the workpiece as a semiconductor substrate having a diameter of at least 200 mm.

3. The method according to claim 1, which comprises providing the material layer as a mask layer.

4. The method according to claim 3, wherein the material layer is a hard mask layer.

5. The method according to claim 1, wherein the material layer includes a silicon nitride layer, a polysilicon layer, or a silicon oxide layer.

6. The method according to claim 1, wherein the plasma etch process is a plasma sputter etch process.

7. The method according to claim 6, wherein the plasma sputter etch process uses an inert gas as an etch gas.

8. The method according to claim 7, wherein the inert gas is Ar.

9. The method according to claim 1, which comprises using at least two independently controllable coils to control the plasma of the plasma etch process.

10. The method according to claim 9, which comprises providing at least one of the coils as a solenoid coil.

11. The method according to claim 9, which comprises concentrically configuring the coils.

12. The method according to claim 1, which comprises performing the etch process directly after a customary etch step.

13. The method according to claim 1, which comprises:
   before performing the etch process, determining at least one parameter of the material layer; and
   adjusting parameters of the etch process based on the parameter of the material layer.

14. The method according to claim 1, which comprises:
   after performing the etch process, determining at least one parameter of the material layers; and
   adjusting parameters of the etch process based on the parameter at the material layer.

15. The method according to claim 1, which comprises:
   before performing the etch process, determining at least one parameter of the material layer;
   determining at least one parameter of a previous material layer after performing the etch process; and
   adjusting parameters of the etch process based on the parameter of the material layer and the parameter of the previous material layer.

16. A processing method for providing a processed material layer on a workpiece, the method which comprises:
   providing a workpiece extending in a radial direction and providing the workpiece with a material layer having an upper surface with a given surface contour along the radial direction;
   positioning the workpiece in a process chamber;
   performing a plasma etch process simultaneously affecting all of the upper surface of the material layer;
   controlling a plasma for the plasma etch process by using at least two independently controllable coils; and
   adjusting an etch rate of the plasma etch process as a non-constant function of a distance from a center of the workpiece by adjusting a plasma density as a function of the distance from the center of the workpiece to obtain a processed material layer having a predetermined surface contour along the radial direction of the workpiece.

17. The method according to in claim 16, which comprises providing the workpiece as a semiconductor substrate having a diameter of at least 200 mm.

18. The method according to in claim 16, which comprises providing the material layer as a mask layer.

19. The method according to in claim 18, wherein the material layer is a hard mask layer.

20. The method according to in claim 16, wherein the material layer includes a silicon nitride layer, a polysilicon layer, or a silicon oxide layer.

21. The method according to in claim 16, wherein the plasma etch process is a plasma sputter etch process.

22. The method according to in claim 21, wherein the plasma sputter etch process uses an inert gas as an etch gas.

23. The method according to in claim 21, wherein the plasma sputter etch process uses Ar as an etch gas.

24. The method according to in claim 16, which comprises providing at least one of the coils as a solenoid coil.

25. The method according to in claim 16, which comprises concentrically configuring the coils.

26. The method according to claim 16, which comprises performing the etch process directly after a customary etch step.

27. The method according to claim 16, which comprises:

before performing the plasma etch process, determining at least one parameter of the material layer; and adjusting parameters of the plasma etch process based on the parameter of the material layer.

28. The method according to claim 16, which comprises:

after performing the plasma etch process, determining at least one parameter of the material layer; and adjusting parameters of the plasma etch process based on the parameter of the material layer.

29. The method according to claim 16, which comprises:

before performing the plasma etch process, determining at least one parameter of the material layer;

determining at least one parameter of a previous material layer after performing the plasma etch process; and adjusting parameters of the plasma etch process based on the parameter of the material layer and the parameter of the previous material layer.

* * * * *